United States Patent [19]

Haferl

[11] 4,081,721
[45] Mar. 28, 1978

[54] CONDUCTION OVERLAP CONTROL CIRCUIT FOR SWITCHED OUTPUT STAGES

[75] Inventor: Peter Eduard Haferl, Zurich, Switzerland

[73] Assignee: RCA Corporation, New York, N.Y.

[21] Appl. No.: 757,375

[22] Filed: Jan. 6, 1977

[30] Foreign Application Priority Data

Feb. 4, 1976 United Kingdom .................. 4406/76

[51] Int. Cl.² ........................ H01J 29/70; H01J 29/72
[52] U.S. Cl. ...................................... 315/389; 315/410
[58] Field of Search ................ 315/389, 399, 408, 410

[56] References Cited

U.S. PATENT DOCUMENTS 3,979,640   9/1976   Fischman et al. .................... 315/387

Primary Examiner—Maynard R. Wilbur
Assistant Examiner—T. M. Blum
Attorney, Agent, or Firm—Eugene M. Whitacre; Paul J. Rasmussen; William H. Meise

[57] ABSTRACT

A negative-feedback arrangement for a switched-mode vertical deflection circuit automatically controls the duration of that overlap portion of the vertical trace interval in which simultaneous conduction of the vertical deflection control switches occurs.

7 Claims, 13 Drawing Figures

CONDUCTION OVERLAP CONTROL CIRCUIT FOR SWITCHED OUTPUT STAGES

BACKGROUND OF THE INVENTION

This invention relates to a kinescope vertical deflection circuit, and more particularly to a crossover distortion control arrangement. Vertical crossover distortion appears on a television kinescope or picture tube as a horizontal white bar across the center of the raster. Crossover distortion is caused by nonlinearity of the vertical deflection sawtooth waveform. Crossover distortion occurs most noticeably in vertical deflection arrangements with two active output devices which conduct alternately during the vertical scan interval. The crossover distortion arises in the region in which the second active output device is taking over the load from the first active output device, near zero deflection current. Deflection arrangements having two active output devices include conventional Class B amplifiers, Class D amplifiers and switched mode vertical deflection arrangements, an example of the latter being in accordance with copending U.S. application Ser. No. 595,809 filed July 14, 1975 for Peter E. Haferl and entitled "VERTICAL DEFLECTION SYSTEM".

The underlying cause for the deflection current distortion at a crossover differs between the three systems mentioned. In the Class B system, crossover distortion occurs because of the nonlinear transconductance (base-emitter voltage to collector-current transfer function) of the output transistors near the zero collector current operating point. Crossover distortion in a Class B system can generally be reduced to an acceptable level by providing a finite minimum (idling) current through the output transistors, in conjunction with degenerative amplitude-dependent feedback around the amplifier. In the Class D vertical defection system, in which constant amplitude square-wave voltage pulses of varying duty cycle are applied to the vertical deflection winding, crossover distortion results from the finite voltage drop of the diodes included as part of the output switches. Crossover distortion in Class D systems can be minimized by appropriate impedance transformations or by reverse conduction of the output switch transistors as described in U.S. Pat. No. 3,939,380 in the name of John Charles Peer and entitled "CLASS D AMPLIFIER".

In a switched mode vertical deflection system as described in the aforementioned copending application, crossover distortion results from the shape of the retrace pulses of the television horizontal deflection system. The switched mode vertical deflection system derives its power directly from the horizontal retract pulses. The retrace pulses are gated and current pulses derived therefrom and having amplitude and polarity varying at the vertical rate are used to charge a capacitor. A vertical deflection winding is connected across the capacitor and the capacitor discharge current through the deflection winding is the sawtooth vertical deflection current.

Control of the two opposite-polarity current pulses from which the sawtooth deflection current is derived in the switched mode vertical deflection system is by means of a thyristor switch for each current polarity. During the first portion of the vertical deflection scan interval, a first thyristor switch is gated on at a time increasingly delayed relative to the leading edges of the horizontal retrace pulses. This results in the application during the first half of the vertical scan interval of current pulses of diminishing magnitude in a first polarity to the sawtooth capacitor. During the second half of the vertical scan interval, the first thyristor is not gated, but the second thyristor is gated on at a time during the retrace interval which is progressively advanced during the remainder of the scan interval. This results in application of current pulses of increasing magnitude to the sawtooth capacitor and consequent sawtooth deflection current.

Since the vertical deflection current in the switched mode vertical deflection circuit is derived by time-dependent gating directly from the horizontal retrace pulse, time-dependent variations in the amplitude of the horizontal retrace pulse will result in nonlinearity of the derived current. In particular, near the center of the vertical scan, when the first switch is gated on near the end of the horizontal retrace interval so as to provide a current pulse of short duration representative of low average deflection current, the small magnitude of the sinusoidal horizontal retrace voltage pulse near the end of the retrace pulse interval will result in a gated current pulse of disproportionately small magnitude. Thus, the vertical deflection current near the center of the vertical scan interval may reach zero current too early, resulting in crossover distortion apparent as a bright white line on the raster.

Crossover distortion in a switched mode vertical deflection circuit cannot be compensated by amplitude-dependent degenerative feedback because the trailing edge of the horizontal retrace pulse contains insufficient energy to supply the required average power. To overcome this problem, the time relative to the horizontal retrace interval at which the first and second switches are gted on near the center of the vertical scan interval in the prior art is moved to a point at which the horizontal retrace pulse contains appreciable energy. This results in an "overlapping" mode of operation about the center of trace, in which the second switch is gated into conduction during horizontal retrace intervals before the center of the vertical scan interval and the first switch ceases conduction at a time after the center of the vertical scan interval. This overlapping operation increases the power capability of the switched mode vertical deflection circuit near the center of the vertical scan. The overlapping operation of the switches serves to compensate for the non-ideal waveshape of the horizontal retrace voltage pulse so as to produce linear current operation through the center region of the vertical scan.

Overlap of the conduction periods of the first and second switches in excess of the amount required to make the crossover distortion insignificant results in excessive power dissipation or may lead to cessation of operation of the horizontal deflection circuit, because the overlapping conduction causes a large circulating current through the vertical deflection circuit and presents an equivalent short-circuited load to the horizontal deflection circuit. Adjustment of the overlap of the conduction times of the vertical control switches for optimum contemporaneity in the aforementioned copending application is manually preset for linear deflection without excessive dissipation.

SUMMARY OF THE INVENTION

A conduction overlap control circuit for switched mode vertical deflection output stages in accordance with an embodiment of the present invention includes a horizontal deflection system, vertical-frequency sawtooth generator and vertical deflection winding. Vertical deflection means coupled to the horizontal deflection system, the sawtooth generator and the vertical deflection winding apply successively smaller portions of the energy of the horizontal deflection drive signal to the vertical deflection winding during a first portion of the vertical deflection period and successively greater portions of the energy of the horizontal deflection drive signal during a second portion of the vertical deflection period. A predetermined contemporaneity or time overlap of the first and second periods is required for best system operation. An overlap control means including summing and signal processing means which generates an error signal indicative of the contemporaneity of the first and second portions of the vertical deflection period and coupling means coupling the error signal to the first means operates in a degenerative feedback manner to reduce the difference between the contemporaneity and the predetermined contemporaneity.

DESCRIPTION OF THE INVENTION

Figure 1:
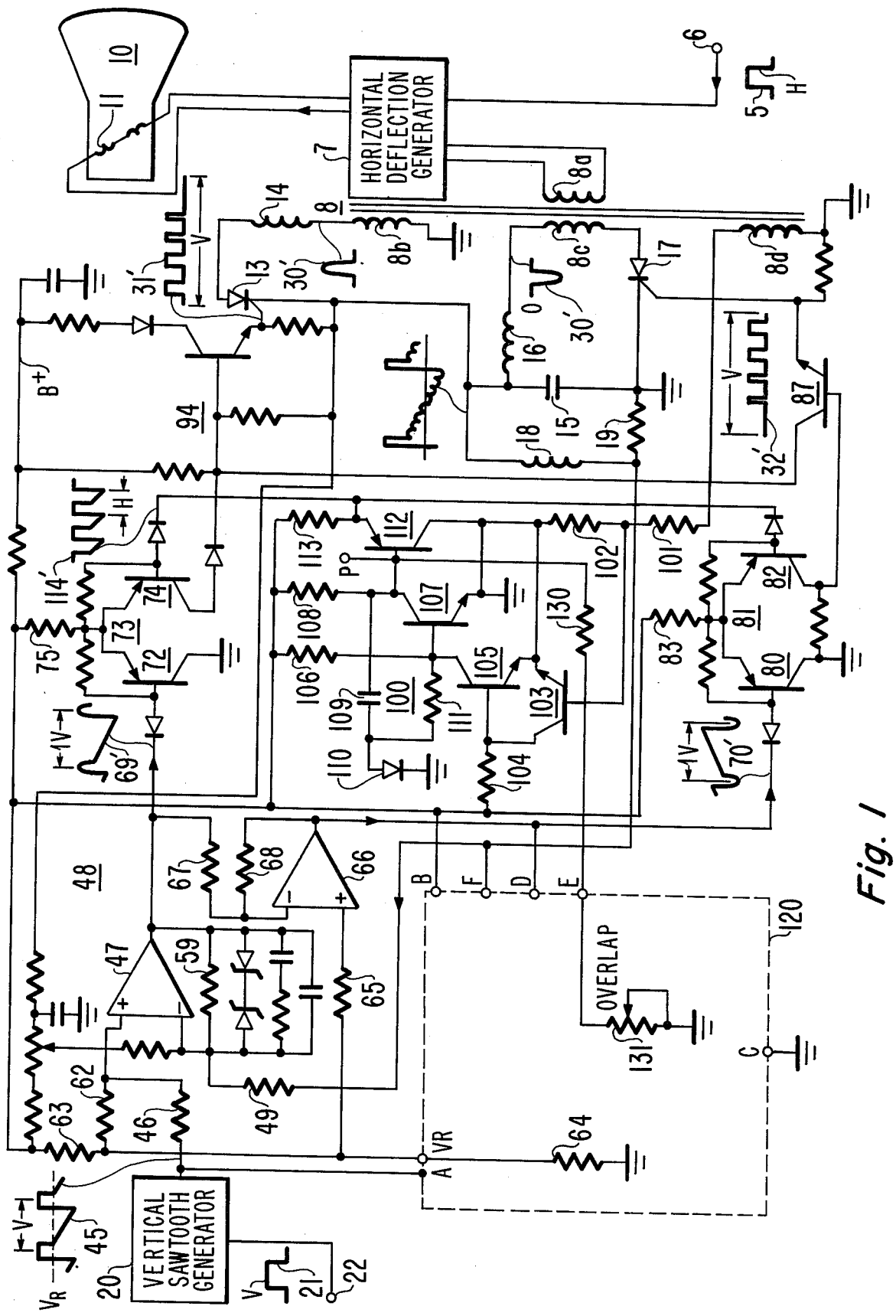
FIG. 1 is a diagram, partially in block and partially in schematic form, of a portion of a television receiver embodying a switched mode vertical deflection system, in accordance with the aforementioned copending application, and indicating the location of connections required for addition of a conduction overlap control circuit in accordance with the invention.

FIG. 1 shows a switched mode vertical deflection circuit which may be incorporated in a television receiver. Horizontal sync pulses 5 from a sync separator, not shown, are coupled to an input terminal 6 of a horizontal deflection generator 7. Horizontal deflection generator 7 may be any suitable type for supplying horizontal deflection current to a horizontal deflection winding 11 mounted adjacent to a cathode ray tube 10 as well as supplying horizontal rate pulses for various functions within a television receiver. A primary winding 8a of a horizontal output transformer 8 receives energy from generator 7.

Figure 2:
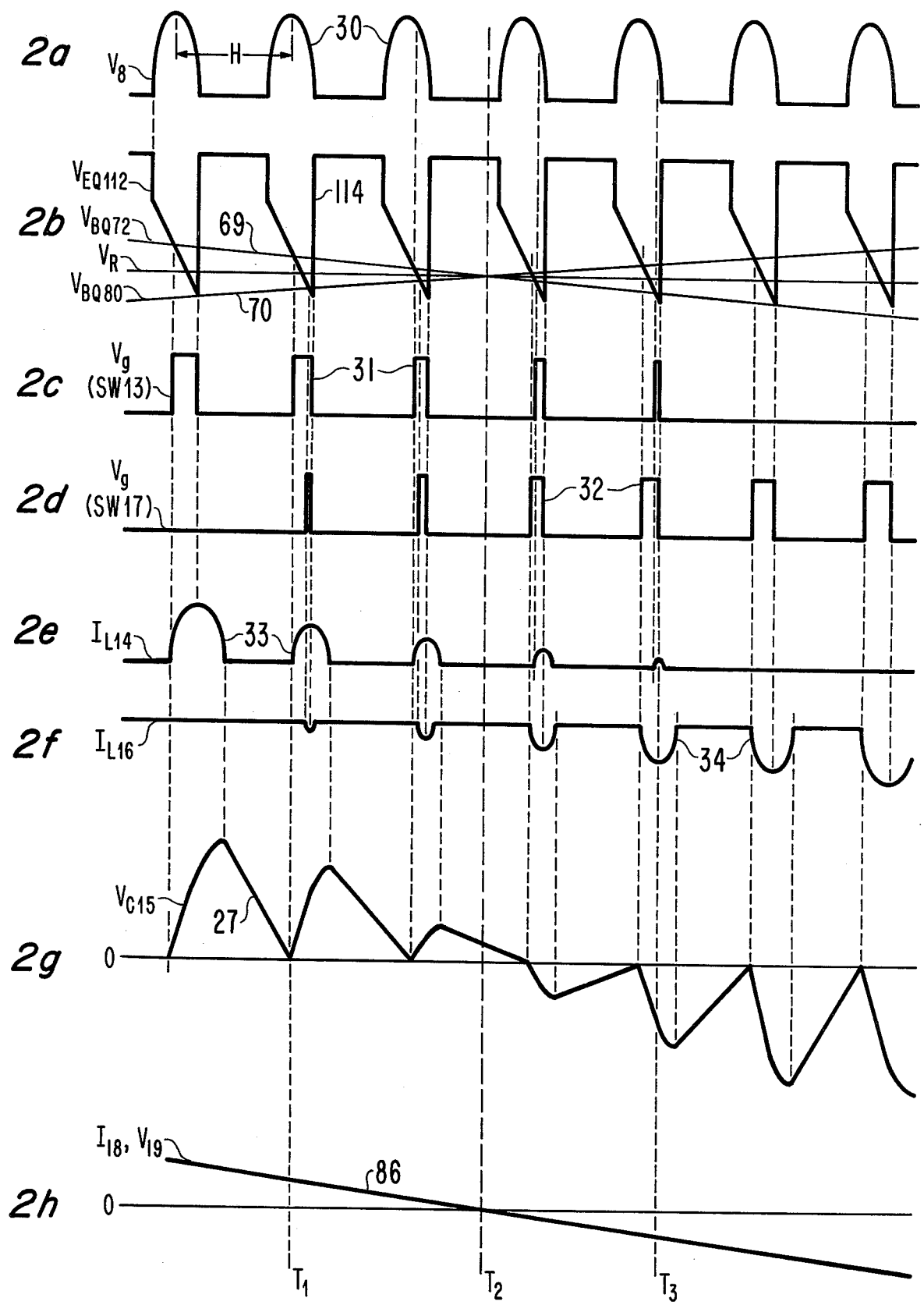
FIGS. 2a–2h ilustrate voltage and current waveforms obtained at various points in the circuit of FIG. 1 near the central portion of a vertical scan interval.

On the secondary side of transformer 8 there are serially connected a vertical control switch thyristor or SCR 13, a secondary winding 8b providing horizontal retrace pulses, illustrated as 30', an inductance 14, an inductance 16, a second secondary winding 8c providing horizontal retrace pulses and a second vertical control switch thyristor 17. Referring to FIG. 2a, a representation of the horizontal retrace voltage pulse 30 appearing at the various secondaries of transformer 8 can be seen. Voltages represented in FIG. 1 corresponding to voltages represented in FIG. 2 are designated by the same reference number, primed. The cathode of thyristor 17 is grounded. Inductor 14 is coupled through thyristor 13 to inductor 16 and both are coupled through a capacitor 15 to ground and also through a vertical deflection winding 18 and a current sampling feedback resistor 19 to ground.

At the upper left of FIG. 1, vertical deflection rate synchronizing pulses represented by pulse 21 and derived from the synchronizing signal separator (not shown) are coupled to an input terminal 22 of vertical sawtooth generator 20. Vertical sawtooth generator 20 produces, at its output, a recurrent vertical rate sawtooth voltage illustrated as waveform 45 in synchronism with vertical synchronizing pulses 21.

The vertical frequency sawtooth voltage from the output of vertical sawtooth generator 20 is applied by way of a resistor 46 to the noninverting input of an amplifier 47. Also applied to the noninverting input of amplifier 47 by way of a resistor 62 is a direct reference voltage $V_R$ obtained from a voltage divider consisting of resistors 63 and 64 connected from the operating supply voltage B+ to ground. The gain of amplifier 47 is established by negative feedback from the output of the amplifier to its inverting input by way of a resistor 59.

The output of amplifier 47 is coupled to the inverting input of an inverting amplifier 66 by way of resistor 67. The gain of amplifier 66 is maintained at unity by means of a degenerative feedback resistor 68 coupled from the output of amplifier 66 to the inverting input. The reference voltage $V_R$ is also applied to the noninverting input of amplifier 66 by way of a resistor 65. Inverting amplifier 66 together with amplifier 47 constitutes a phase splitting driver amplifier 48 for the power controlling stages of the switched mode vertical deflection system.

The output of amplifier 47 is applied to a first input of a top-of-scan pulse width modulator 73. The output of inverting amplifier 66 is applied to a first input of a bottom-of-scan pulse width modulator 81. Pulse width modulators 73 and 81 have second inputs to which horizontal-rate pulses are applied and generate control switch gating pulses by amplitude comparison of the signals applied at their first and second inputs. The control switch gating pulses produced by pulse width modulators 73 and 81 are represented by voltages 31' and 32' and are applied to the gates of control switch thyristors 13 and 17 respectively through emitter followers designated generally as 87 and 94.

Near the center of FIG. 1 ramp-on-pulse generator 100 can be found. A transistor 105 at an input of generator 100 has bias applied to its base by a resistor 104. The bias voltage maintains transistor 105 normally saturated. Transistor 105 is periodically rendered nonconductive by horizontal retrace pulses induced in transformer secondary 8d and coupled to the base of transistor 105 by inverting amplifier 103 and a voltage divider consisting of resistors 101 and 102. Transistor 105 has its collector to emitter conduction path coupled across the base-emitter junction of a transistor 107. When transistor 105 is saturated, transistor 107 is rendered nonconductive by lack of base-emitter bias. The emitter of transistor 107 is grounded and the collector is connected to the operating supply voltage by means of a load resistor 108. Transistor 107 is connected in a Miller feedback arrangement including a capacitor 109 and resistor 111 serially coupled in that order between its collector and base. The base of transistor 107 is also coupled to the operating supply voltage by a resistor 106.

When transistor 105 is saturated, substantially all the current flowing in resistor 106 flows directly to ground through the collector to emitter path of transistor 105. Since transistor 107 is thereby rendered nonconductive, its collector voltage rises to a voltage established by a voltage divider including load resistor 108 and the series combination of a resistor 130 and variable resistor 131 connected between the collector of transistor 107 and ground. The collector voltage of transistor 107 is coupled to the second inputs of pulse width modulators 73 and 81 by means of an emitter follower transistor 112 and associated emitter resistor 113.

When transistor 107 is nonconductive, capacitor 109 charges to the voltage at the collector of transistor 107 through a diode 110 coupled between ground and the junction of capacitor 109 and resistor 111. At the instant that transistor 105 is rendered nonconductive, the current flowing in resistor 106 tends to turn transistor 107 on. Conduction of transistor 107 reduces the collector potential of transistor 107, coupling a negative voltage through capacitor 109 which cuts off diode 110 and which causes substantially all the current flowing in resistor 106 not required to maintain transistor 107 conductive to flow through resistor 111. This discharges capacitor 109 and results in a decreasing sawtooth voltage at the collector of transistor 107 during the horizontal retrace interval. The additional voltage drop attributable to current flow through resistor 111 causes the sawtooth collector voltage to be superimposed upon a pulse voltage, as represented by waveform 114'.

At the end of the horizontal retrace interval, the inverted horizontal retrace pulse produced by transformer secondary 8d no longer reverse-biases the base-emitter of transistor 105, and transistor 105 once again becomes saturated. The collector voltage of transistor 107 returns to the value established by the voltage divider consisting of resistors 108, 130 and 131.

The current flow through resistor 106 is essentially constant during the horizontal retrace interval. The pulse voltage offset produced by resistor 111 is therefore substantially constant, since the current from resistor 106 flowing into the base of transistor 107 is negligible. The slope of the ramp voltage superimposed on the pulse is established by the discharge current through capacitor 109, which is the same constant current flowing in resistor 111. The voltage over which the ramp portion of the ramp-on-pulse output 114' of generator 100 ranges can therefore be controlled by adjustment of resistor 131. FIG. 2b shows voltage pulses 114 coupled from the output of ramp-on-pulse generator 100 to the two pulse width modulators 73 and 81. In FIG. 2 the difference between successive horizontal intervals are emphasized for ease of explanation.

FIG. 2b also shows sawtooth voltage 69 which is applied to the first input of modulator 73 and inverted sawtooth 70 which is applied to the first input of modulator 81. In FIG. 2b, the relationship between sawtooth voltages 69 and 70, pulse 114 and reference voltage $V_R$ is shown by their relative position, with increasing positive voltages towards the top of the FIGURE. The relative voltages or positions of ramp-on-pulse 114, sawtooth voltages 69 and 70 and the reference voltage as shown in FIG. 2b are for the condition of correct or optimum overlap or contemporaneous conduction of the vertical control switch thyristors. The period of contemporaneity is that period $T_1$ to $T_3$ about the center time $T_2$ of the vertical scan interval during which each ramp-on-pulse 114 intersects both sawtooth voltages 69 and 70.

In FIG. 1, pulse width modulator 73 consists of a differential amplifier including transistors 72 and 74. Resistor 75 couples the common emitters of transistors 72 and 74 to operating potential. Sawtooth waveform 69' is applied to the base of transistor 72 and pulse waveform 114' is applied to the base of transistor 74. Modulator 73 produces an output from the collector of transistor 74 when the base voltage of transistor 74 is more negative than the base voltage of transistor 72. Referring now to FIG. 2c, it can be seen that voltage pulses 31 representing the output of transistor 74 of modulator 73 occur during those times when pulses 114 are more negative than sawtooth voltage 69.

Similarly, pulse width modulator 81 consists of a differential amplifier including transistors 80 and 82 and a common emitter resistor 83. Modulator 81 produces an output from the collector of transistor 82 during those times when the instantaneous pulse voltage represented by pulse 114 of FIG. 2b is more negative than the inverted sawtooth voltage 70 applied to the base of transistor 80. Referring to FIG. 2d, it can be seen by comparison with FIG. 2b that voltage pulse output 32 at the collector of transistor 82 occurs during those periods when pulses 114 are more negative than inverted sawtooth voltage 70.

Referring now to FIG. 2e, the current in vertical control switch thyristor 13 and series connected inductor 14 is shown. During the horizontal retrace interval, an anode-to-cathode voltage 30 appears across thyristor 13 poled for forward current flow through the thyristor. However, thyristor 13 does not conduct until a control switch gating pulse such as 31 of FIG. 2c is applied to its gate electrode. At that instant, thyristor 13 conducts and the horizontal retrace voltage pulse produced by secondary winding 8b is applied across the series circuit consisting of inductor 14 and capacitor 15. Current pulses 33 flow in inductor 14 in response to the applied voltage to charge capacitor 15 in a first polarity.

As can be seen by examining current pulses 33 of FIG. 2e, the current through inductor 14 does not increase instantaneously to the maximum value. Also, current continues to flow through the series combination of thyristor 13, secondary 8b, inductor 14 and capacitor 15 after the termination of the control switch gating pulse 31 because of the energy stored in the magnetic field of inductor 14 and the characteristics of the thyristor. Inductor 14 discharges all of its energy into capacitor 15 in a resonant manner during and immediately after each horizontal retrace pulse. When the resonant circuit consisting of inductor 14 and capacitor 15 attempts to reverse the current through thyristor 13, thyristor 13 becomes nonconductive and prevents further current flow. Thyristor 13 remains nonconductive until the succeeding horizontal retrace pulse is applied in conjunction with a control gate pulse.

In a similar manner, current pulses represented as 34 of FIG. 2f flow through thyristor 17, secondary 8c and inductor 16 to charge capacitor 15 in the opposite polarity. Capacitor 15 is discharged by the deflection current through inductor 18. The voltage appearing across capacitor 15 as a result of this charging and discharging is shown as waveform 27 in FIG. 2g. Vertical deflection winding 18 integrates the voltage on capacitor 15 to form a substantially linear sawtooth deflection current represented as waveform 86 of FIG. 2h.

Deflection current 86 flowing in deflection winding 18 in response to the voltage appearing across capacitor 15 flows to ground through a current sensing resistor 19. The voltage appearing across resistor 19 corresponds directly with the deflection current by a scale factor depending on the magnitude of resistance of 19. Consequently, waveform 86 of FIG. 2h can also represent the voltage across resistor 19. The voltage across resistor 19 is fed back by means of a resistor 49 to the inverting input of driver amplifier 48, and is of a polarity to subtract from the sawtooth 45 applied to the noninverting input of driver amplifier 48. Thus the output voltages 69' and 70' of driver amplifier 48 represent amplified error voltage in an amplitude-controlling degenerative feedback loop.

Referring again to FIG. 2c, it can be seen that control switch gating pulse 31 occurs both prior to and after the time $T_2$ of center of vertical scan. Similarly, some switch gating pulses 32 occur at times preceding the time $T_2$ of the center of vertical scan. As mentioned, this is done in order that the control switch may be gated at times of the horizontal retrace interval at which sufficient energy may be extracted to sustain the required vertical deflection power, and results in contemporaneity or simultaneous switch conduction. Simultaneous switch conduction results in circulation of current through the switch thyristors, inductors 14 and 16 and presents a low-impedance load to secondary windings 8b and 8c.

The expert will recognize that overlap control potentiometer 131, controlling the voltage over which ramp-on-pulse 114 ranges, will control the intersection with vertical-rate sawtooth error voltages 69 and 70. This in turn controls the duration of control switch gating pulses 31 and 32 and the conduction of thyristors 13 and 17. The contemporaneity control as described in conjunction with FIG. 1 will be recognized as an open-loop control. A particular setting of overlap control resistor 131 which at a certain time results in optimum contemporaneity may as a result of component aging, changes in operating voltage and temperature result at another time in an insufficient or excessive contemporaneity.

Figure 3:
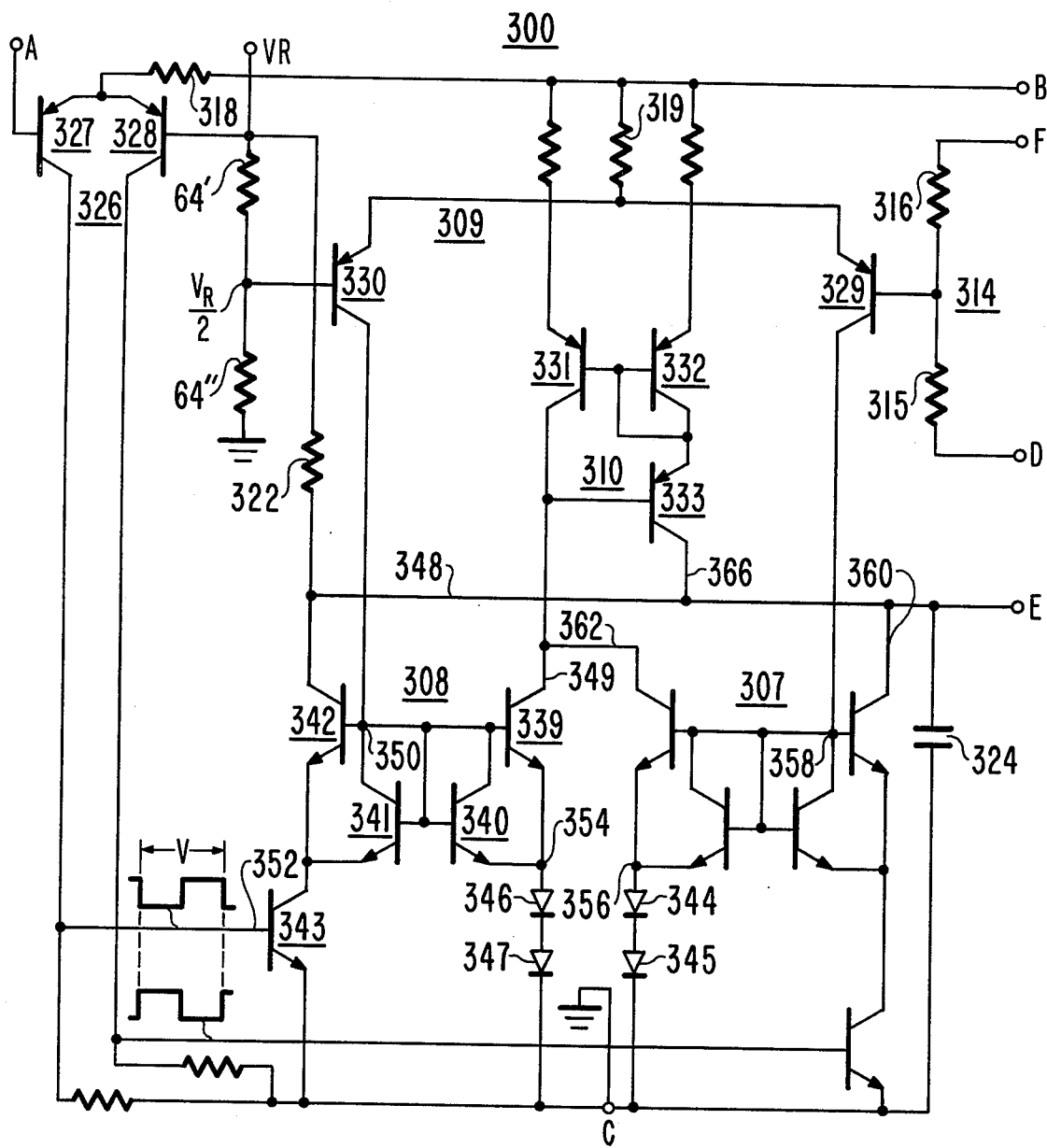
FIG. 3 shows an embodiment of the conduction overlap control circuit manifested as a summing and signal processing circuit 300.

The present invention is embodied in a closed-loop negative feedback contemporaneity control implemented by substituting for block 120 of FIG. 1, containing resistors 64 and 131, a summing and signal processing circuit designated as 300 and described below. The function of summing and signal processing circuit 300 of FIG. 3 is to generate an error signal indicative of the state of contemporaneity relative to a desired contemporaneity. Terminals A-F and VR of summing and signal processing circuit 300 are adapted to be connected to corresponding terminals of FIG. 1.

Referring to FIGS. 1, 2 and 3, it will be noted that terminal F connects the feedback voltage 86 generated across current sensing resistor 19 to one end of a resistor 316 of summing and signal processing circuit 300. Similarly, terminal D couples the inverted amplitude-error drive voltage 70 from driver amplifier 48 to one end of a resistor 315. The other ends of resistors 315 and 316 are coupled together and form the output of a summing network 314.

FIG. 5a illustrates a feedback voltage 86 as applied to terminal F and FIG. 5b shows amplitude-error voltage 70 as applied to terminal D during one vertical interval of operation under conditions of optimum contemporaneity. The average value of feedback voltage 86 is zero over a vertical interval, and the average value of amplitude-error voltage 70 is equal to reference voltage $V_R$. The voltage excursion of sawtooth feedback voltage 86 is equal to that of the sawtooth portion of amplitude-error voltage 70. This is accomplished by appropriate selection of the magnitude of the current source resistor 106 and the current sensing resistor 19 which may be matched to the vertical deflection yoke winding impedance. The value of resistor 106 determines the amplitude of the horizontal ramp 114 and in turn the amplitudes of the error voltages 69 and 70.

With the resistance of resistors 315 and 316 set equal, the average value of the sum voltage at the junction of resistors 315 and 316 will be exactly one-half the reference voltage $V_R$, or $V_R/2$.

As shown in FIG. 5c, the oppositely-directed sawtooth portions of feedback voltages 86 and amplitude-error voltage 70 will cancel, or sum, at the output of summing network 314 to a voltage 412 equal to half the reference voltage $V_R$ during the vertical scan interval.

The remaining of summing and signal processing circuit 300, including a differential amplifier 309, current alternators 307 and 308 under the control of a differential amplifier 326, together with a current mirror 310 apply a current derived from the voltage at the output of summing network 314 to integrating capacitor 324 in a polarity switched at the center and again at the end of the vertical scan interval. Capacitor 324 integrates the switched current to produce a contemporaneity-error voltage at terminal E which varies about a reference value as a function of contemporaneity. Terminal E is coupled to terminal $V_R$ by a resistor 322, and the quiescent voltage at terminal E will be equal to the reference voltage $V_R$ applied to terminal VR.

During the first half of the vertical scan interval, the output of summing network 314 is compared by an emitter coupled differential amplifier 309 with a reference voltage equal to half the reference voltage $V_R$ applied to terminal VR from FIG. 1. Differential amplifier 309 consists of transistors 329 and 330 having their emitters coupled together and to an operating supply voltage B+ at terminal B by resistor 319, and having their bases coupled to the output of summing network 314 and to a tap between voltage divider resistors 64' and 64", respectively. Voltage divider resistors 64' and 64" are equal in magnitude and their sum equals the resistance of resistor 64 of FIG. 1. Under conditions of optimum contemporaneity, the voltage out of summing network 314 equals the half reference voltage $V_R/2$, and the collector current of transistor 329 equals that of transistor 330.

Figures 4, 5, 6:
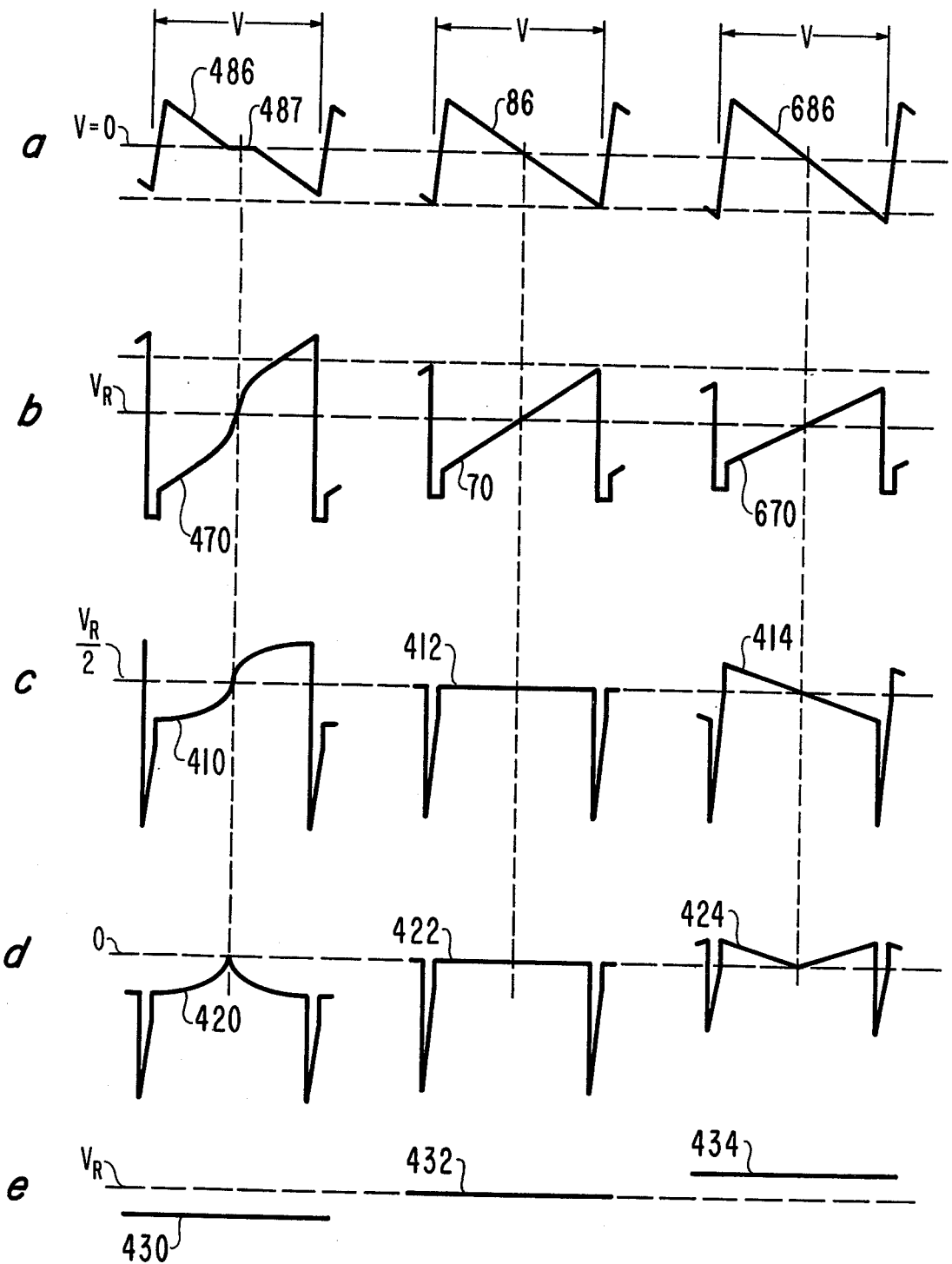
FIGS. 4, 5 and 6 illustrate some of the voltage waveforms of FIGS. 1 and 2 over an entire vertical scanning interval, together with voltage and current waveforms generated by the summing and signal processing circuit of FIG. 3, for different operating conditions of the circuit.

FIG. 4 represents the waveforms of FIG. 5 under conditions of insufficient contemporaneity. Under these conditions, the amplitude feedback voltage 486 coupled to resistor 316 has, as shown in FIG. 4a, a nonlinear waveform portion 487 caused by insufficient deflection current near the center of scan. This in turn results in an amplitude-error voltage shown as waveforms 470 of FIG. 4b which is of greater magnitude over the vertical scan interval than for optimum contemporaneity, and which additionally is nonlinear near the center of scan due to the effect of the amplitude-controlling feedback loop in correcting for the insufficient deflection current. The nonlinear waveform portion 487 represents crossover distortion manifested as a pause in the vertical scanning, which results in bright horizontal line at the center of scan, as mentioned.

During the first half of the vertical scan interval under conditions of insufficient contemporaneity, the sum voltage applied to differential amplifier 309 from summing network 314 will be negative with respect to the quiescent value of $V_R/2$, as shown by voltage waveform 410 of FIG. 4c. Consequently, transistor 329 will be more conductive than transistor 330. During the second half of the vertical scan interval, the sum voltage will be more positive than reference voltage $V_R/2$ and transistor 330 will be more conductive than transistor 329.

FIG. 6a shows as voltage waveform 686 the feedback voltage from resistor 19 to terminal F under conditions of excessive contemporaneity. Waveform 686 is linear through the center portion of the scan interval, and is greater in magnitude than in the case of optimum contemporaneity because of the increased deflection drive available from vertical control switch thyristors 13 and 17. The corresponding amplitude-error voltage represented as waveform 670 of FIG. 6b is reduced in magnitude as compared with the case of optimum contemporaneity, reflecting the effect of the amplitude feedback in compensating for the increased drive. During the first half ot the vertical scan interval under excessive contemporaneity, the sum voltage represented as waveform 414 of FIG. 6c is more positive than the half reference voltage $V_R/2$, and maintains transistor 329 less conductive than transistor 330. Conversely, during the second half of the vertical scan interval sum voltage 414 is negative with respect to the half reference voltage and transistor 329 is more conductive than transistor 330.

The collector current of transistor 329 is applied to input junction 358 of a current alternator 307, and the collector current of transistor 330 is applied to an input junction 350 of a current alternator 308. Current alternators 307 and 308 replicate the current applied to their input junctions on output conductors 360 or 362 and 348 or 349, respectively, under the control of differential amplifier 326.

Differential amplifier 326 consists of emitter coupled transistors 327 and 328 and a resistor 318 connecting their emitters to the supply voltage at terminal B. The base of transistor 328 is connected to terminal VR and is maintained at reference voltage $V_R$. Differential amplifier 326 assumes one of two states under the control of the vertical rate sawtooth voltage 45 applied to terminal A from vertical oscillator and sawtooth generator 20 of FIG. 1. During the first half of the vertical scan interval, sawtooth voltage 45 is positive with respect to reference voltage $V_R$ and maintains transistor 327 nonconducting and transistor 328 conducting. During the second half of the vertical scan interval the sawtooth voltage is more negative than reference voltage $V_R$, and transistor 327 is maintained conductive to the exclusion of transistor 328.

Current alternator 308 includes transistors 339 and 342 having their bases coupled to input junction 350. Transistors 339 and 342 have diode-connected transistors 340 and 341, respectively, coupled in parallel with and poled in the same direction as their base-emitter junctions. The junction 354 of the emitters of transistors 339 and 340 is coupled to ground at common terminal C through the series connection of diodes 346 and 347, and the joined emitters of transistors 341 and 342 are coupled to terminal C through the collector-to-emitter path of a transistor 343 the base of which forms the switching input 352 of current alternator 308. The collector of transistor 327 is coupled to switching input 352.

During the first half of the vertical scan interval transistor 327 is nonconductive and transistor 343 is therefore nonconductive. A current applied to input junction 350 of current alternator 308 from the collector of transistor 330 will raise the voltage at input junction 350 to 3 $V_{BE}$ and forward bias diodes 340, 346 and 347 as it flows to ground, and will as is known replicate the current at the collector of transistor 339 connected to output conductor 349 of alternator 308. During the second half of the vertical scan interval, transistor 327 conducts, saturating transistor 343 and providing a preferred path to ground through diode 341 for current applied to input junction 350, thereby replicating the input current on output conductor 348 at the collector of transistor 342. With transistor 343 saturated, the voltage at input junction 350 is about one $V_{BE}$, so diodes 340, 346 and 347 are maintained nonconductive by insufficient forward bias.

Similarly, the collector of transistor 328 is coupled to the switching input of current alternator 307. When transistor 328 is conductive during the first half of the vertical scan interval, current applied to input junction 358 of current alternator 307 will be replicated on output conductor 360, and during the second half of the vertical scan interval the current will be replicated on output conductor 362. It should be noted that junction 356 at the ungrounded end of series diode string 344 and 345 of current alternator 307 may be coupled to junction 354 of current alternator 308, in which case diode string 344 and 345 may be dispensed with. In this alternative arrangement, combined junctions 354 and 356 are maintained at $2V_{BE}$, and switching occurs as described. Nonconduction of diode 340 when transistor 343 is conductive is by reverse bias of the base-emitter junction rather than by insufficient bias.

Output conductors 348 and 360 of the current alternators are coupled to terminal E directly, and output conductors 349 and 362 are coupled to output terminal E through a current mirror 310. Current applied to the joint collector of transistor 331 and base of transistor 333 of current mirror 310 reduces the base voltage of transistor 333 until collector-to-emitter conduction of transistor 333 through diode-connected transistor 332 coupled across the base-emitter junction of transistor 331 causes the current of transistor 331 to equal the applied current.

In operation during the first half of the vertical scan interval, the collector current of transistor 330 is replicated by current alternator 308 and again by current mirror 310 on conductor 366. The collector current of transistor 329 is replicated by current alternator 307 on conductor 360. Under conditions of optimum contemporaneity when the collector currents of transistors 329 and 330 are equal, current on conductor 366 tending to increase the charge on capacitor 324 and voltage at output terminal E exactly equals discharging on conductor 360 as shown by sum current waveform 422 of FIG. 5d. Consequently, the voltage on capacitor 324 and at terminal E remains at the nominal value $V_R$ as shown by 432 of FIG. 5e. With insufficient contemporaneity, transistor 329 conducts more heavily than transistor 330 with the result that discharging current on conductor 360 exceeds charging current on conductor 366 as shown by 420 of FIG. 4d, and the integrated contemporaneity-error voltage 430 of FIG. 4e at terminal E becomes more negative. Conversely, for excessive contemporaneity transistor 330 conducts more heavily than transistor 329, and the net charging current 424 of FIG. 6d results in an increase in the contemporaneity-error voltage at terminal E as shown by 434 of FIG. 6e.

During the second half of the vertical scan interval, the collector current of transistor 330 is replicated by current alternator 308 on output conductor 348 and represents a discharging current for capacitor 324. The collector current of transistor 329 is replicated by current alternator 307 and current mirror 310 and charges capacitor 324. As before, the charging and discharging currents of capacitor 324 are equal under conditions of optimum contemporaneity and the contemporaneity-error voltage remains at $V_R$. For insufficient contemporaneity, charging current originating in transistor 329 is exceeded by discharging current originating in transistor 330, maintaining the contemporaneity-error voltage negative. For conditions of excessive contemporaneity, charging current from transistor 329 dominates and the error voltage increases. Consequently, the contemporaneity-error voltage is positive or negative with respect to a reference voltage as the contemporaneity is excessive or insufficient, respectively.

The contemporaneity-error voltage is applied from terminal E of summing and signal processing circuit 300 of FIG. 3 to resistor 130 of FIG. 1 to close the degenerative contemporaneity control feedback loop. A positive excursion of the contemporaneity-error voltage from the nominal value will have the same effect as an increase in the resistance of overlap control to potentiometer 131, and a negative excursion from the nominal simulates a reduced resistance of potentiometer 131. This poling is such that when the feedback loop is closed, deviations between the contemporaneity and the contemporaneity at the nominal error voltage tend to be reduced.

Resistor 130 is selected of such a value in an open-feedback loop condition that optimum contemporaneity occurs when the contemporaneity-error voltage is at the reference value $V_R$. This helps to avoid feedback system malfunctions such as latch-up.

In FIG. 1, terminal P is coupled to the junction between resistor 130 and the collector of resistor 107. Terminal P is adapted to be connected to a tap on a resistive voltage divider (not shown) connected between the source of operating potential and ground. Selection of appropriate voltage divider impedance and voltage allows injection of a current into generator 100 which slightly modifies the effect of the voltage at terminal E on the contemporaneity. This in turn provides some control over side or East-West pincushion, whereby increased contemporaneity loads the horizontal deflection circuit more heavily and decreases horizontal deflection magnitude.

Other arrangements and embodiments of the invention will be apparent to those skilled in the art. In particular, it should be noted that the invention may be practised with a switched-mode vertical deflection system similar to that of FIG. 1 in which the amplitude-control feedback loop is opened by disconnecting the feedback from resistor 19 to driver amplifier 48, as by removing resistor 49. In such an arrangement, the output of driver 48 is a linear replica of voltage sawtooth 45 and the switched mode vertical deflection circuit is open-loop as to amplitude control.

In the summing and signal processing circuit 300 of FIG. 3, and feedback coupling means in FIG. 1 the following components and values were found effective:

| Resistors | Ohms |
|---|---|
| 322 | 2200 |
| 64',64",315,316 | 4700 |
| 319 | 6800 |
| 318 | 10,000 |
| 130 | 22,000 |
| Capacitors | μFd |
| 324 | 47 |
| | Volts |
| Operating Supply Voltage | +24 |

What is claimed is:

1. Feedback overlap control means for a television kinescope drive apparatus comprising:
    a horizontal deflection circuit for producing a recurrent horizontal deflection drive signal;
    a vertical deflection winding disposed about the kinescope for deflecting an electron beam of the kinescope vertically in response to current therethrough;
    a source of recurrent vertical-frequency sawtooth signal;
    vertical deflection means responsive to said vertical-frequency sawtooth signal for applying successively smaller portions of the energy of said horizontal deflection drive signal during a first interval of the vertical deflection period and successively greater portions of the energy of said horizontal deflection drive signal during a second interval of the vertical deflection period to said vertical deflection winding for producing a vertical-frequency sawtooth current therethrough, a predetermined contemporaneity of said first and second intervals being optimum;
    said feedback overlap control means further comprising;
    summing and signal processing means responsive to said vertical-frequency sawtooth current and to said vertical frequency sawtooth signal for generating at an output terminal a first error signal indicative of the contemporaneity of said first and second intervals, and
    error signal coupling means for coupling said first error signal to said vertical deflection means for reducing the difference between the contemporaneity and said predetermined contemporaneity.

2. Feedback overlap control means in accordance with claim 1
    further comprising current sensing means coupled to said vertical deflection winding for producing a feedback signal therefrom, and wherein
    said source of recurrent vertical-frequency sawtooth signal comprises an error amplifier including a first input coupled to receive vertical-frequency input signals and a second input coupled to said feedback signal and responsive thereto to produce said vertical-frequency sawtooth signal as an amplitude-error voltage of an amplitude control feedback loop.

3. Feedback overlap control means in accordance with claim 2 wherein said current sensing means comprises resistance means serially coupled with said vertical deflection winding.

4. Feedback overlap control means in accordance with claim 1, 2 or 3 wherein said summing and signal processing means further comprises;

summing means including a first input coupled to said vertical deflection winding and a second input coupled to said source of recurrent vertical-frequency sawtooth signals and responsive to said vertical-frequency sawtooth current and to said vertical-frequency sawtooth signals to produce a sum signal therefrom, control current generating and alternating means coupled to said summing means and to said source of recurrent vertical-frequency sawtooth signals for generating said first error signal in response to said sum signal and for applying said first error signal to said output terminal in a polarity alternated during the vertical deflection period, and wherein said error signal coupling means further comprises integrating means for integrating said alternated first error signal to a control voltage and for applying said integrated first error signal to said vertical deflection means.

5. Feedback overlap control means in accordance with claim 4 wherein said summing means comprises first and second resistance means serially coupled between said source of recurrent vertical-frequency sawtooth signal and said vertical deflection winding and forming said sum signal at the junction of said first and second resistance means, said control current generating and alternating means comprises differential amplifier means including an input coupled to said junction of said first and second resistance means and responsive to said sum signal for generating first and second control currents at first and second outputs thereof;

first current alternating means including a current input terminal coupled to said first output of said differential amplifier and replicating said first control current or one of a first or second replicated current output terminals and including a switch control input, second current alternating means having a current input terminal coupled to said second output of said differential amplifier and replicating said second control current on one of a first and second replicated current output and including a switch control input, means for coupling said first replicated current output of said first current alternator with said second replicated current output of said second current alternator together and to said output terminal of said summing and signal generating means, and for coupling said first replicated current output of said second current alternator with said second replicated current output of said first current alternator and in reversed polarity with said output terminal of said summing and signal processing means;

and switching control means coupled to said source of recurrent vertical-frequency signals and to said switch control inputs of said first and second current alternators and responsive to said recurrent vertical-frequency currents for switching the output of said current alternators to apply the difference between said first and second control currents to said output terminal of said summing and signal processing means to form said first error signal, and wherein said integrating means comprises capacitance means.

6. Feedback overlap control means for a television kinescope drive apparatus comprising:

a horizontal deflection circuit for producing a recurrent horizontal deflection drive signal;

a vertical deflection winding disposed about the kinescope for deflecting an electron beam of the kinescope vertically in response to current therethrough;

a source of recurrent vertical-frequency sawtooth signal;

vertical deflection means responsive to said vertical-frequency sawtooth signal for applying successively smaller portions of the energy of said horizontal deflection drive signal during a first interval of the vertical deflection period and successively greater portions of the energy of said horizontal deflection drive signal during a second interval of the vertical deflection period to said vertical deflection winding for producing a vertical-frequency sawtooth current therethrough, a predetermined contemporaneity of said first and second intervals being optimum;

said feedback overlap control means further comprising:

signal processing means responsive to the duration of that portion of said first interval of the vertical deflection period common with said second interval of the vertical deflection period for generating at an output terminal a first error signal indicative of the contemporaneity of said first and second intervals, and error signal coupling means for coupling said first error signal to said vertical deflection means for reducing the difference between the contemporaneity and said predetermined contemporaneity.

7. Feedback overlap control means in accordance with claim 6 wherein said signal processing means is responsive to said vertical-frequency sawtooth current and to said vertical-frequency sawtooth signal for generating said first error signal.

* * * * *